United States Patent [19]

Carsello

[11] Patent Number: 5,678,215
[45] Date of Patent: Oct. 14, 1997

[54] METHOD FOR FREQUENCY LOCKING ONTO A PILOT REFERENCE SIGNAL AFFECTED BY MULTIPATH FADING

[75] Inventor: Stephen R. Carsello, Ft. Worth, Tex.

[73] Assignee: Motorola, Inc., Schaumburg, Ill.

[21] Appl. No.: 664,077

[22] Filed: Jun. 13, 1996

[51] Int. Cl.$^6$ .................................................. H04B 1/16
[52] U.S. Cl. .................. 455/265; 455/182.2; 455/192.2; 455/257; 455/71; 375/344
[58] Field of Search .................. 455/182.1, 182.2, 455/182.3, 192.1, 192.2, 192.3, 196.1, 255, 257, 258, 259, 260, 264, 265, 316, 65, 67.1, 71, 226.1; 375/344

[56] References Cited

U.S. PATENT DOCUMENTS

| 4,348,772 | 9/1982 | Leland et al. | 455/264 |
| 4,630,283 | 12/1986 | Schiff | 375/344 |
| 4,718,116 | 1/1988 | Jacobs et al. | 455/265 |
| 5,249,202 | 9/1993 | Hillum et al. | 455/71 |
| 5,361,398 | 11/1994 | Christian et al. | |
| 5,548,811 | 8/1996 | Kumagai et al. | 455/260 |

Primary Examiner—Reinhard J. Eisenzopf
Assistant Examiner—Thanh Le
Attorney, Agent, or Firm—John H. Moore; Eduardo Guntin

[57] ABSTRACT

A radio receiver (700) uses automatic frequency control for locking a controlled reference signal (108) to a pilot reference signal (114) that has been distorted by multipath fading. The radio receiver (700) is programmed to sample the pilot reference signal (114) over a predetermined time interval to determine an average pilot frequency, and applies a first weighting function to the average pilot frequency to generate a weighted pilot frequency and a second weighting function to a controlled frequency of the controlled reference signal (108) to generate a weighted controlled frequency. The radio receiver (700) sums the weighted pilot frequency with the weighted controlled frequency to provide an update frequency, and modifies the controlled reference signal (108) such that its frequency matches the update frequency. The radio receiver (700) continues these programmed steps so as to lock the controlled reference signal (108) to the pilot reference signal (114).

14 Claims, 8 Drawing Sheets

METHOD FOR FREQUENCY LOCKING ONTO A PILOT REFERENCE SIGNAL AFFECTED BY MULTIPATH FADING

FIELD OF THE INVENTION

This invention relates in general to radio receivers, and more specifically to radio receivers that frequency lock to a pilot reference signal affected by multipath fading.

BACKGROUND OF THE INVENTION

Radio receivers applying conventional frequency-locked loops that utilize pilot-aided linear modulation schemes demand a very accurate conventional local oscillator for mixing down AM signals that include a pilot reference signal. Without an accurate local oscillator, the performance of the radio receiver may be degraded significantly such that a message received by the radio receiver may be distorted to a point of unintelligibility.

In situations where noise distortion is minimal, the required accuracy of the local oscillator is relaxed. In this case a conventional oscillator provides adequate means for receiving messages without much degradation.

However, when a transmitted AM signal is distorted by, for example, fast Rayleigh fading the accuracy necessary of the local oscillator to receive the AM signal with minimal distortion is impracticable. For AM signals that include single-sideband voice messages, fast Rayleigh fading can result in an undesirable quality of voice message reception that may not conform with customer expectations.

Thus, what is needed is a method and apparatus that can frequency lock onto a pilot reference signal affected by multipath fading. In particular, the method must be efficient in its use of hardware resources in order to minimize power consumption, and must achieve frequency lock in a reasonable time.

DESCRIPTION OF THE PREFERRED EMBODIMENT

Figure 1:
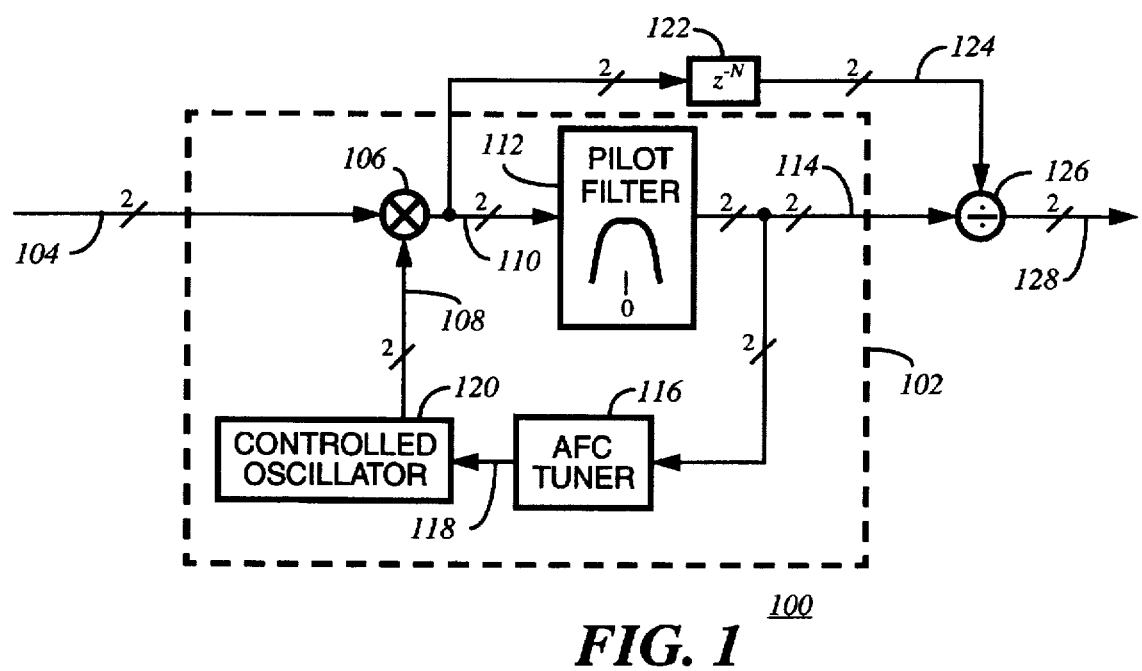
FIG. 1 is an electrical block diagram of an AM demodulator according to the present invention.

FIG. 1 is an electrical block diagram of an AM demodulator 100 according to the present invention. The AM demodulator 100 is utilized for demodulating an AM signal 104 that has been distorted by multipath fading. The AM signal 104 includes a pilot reference signal and single-side band information that has been distorted by, for example, fast Rayleigh fading (at, e.g., 60 miles per hour at a carrier frequency of 900 MHz). The pilot reference signal is used by the AM demodulator 100 for frequency locking onto the AM signal 104 and for canceling the distortion caused by fast Rayleigh fading.

To accomplish this process, the AM demodulator includes an automatic frequency controller (AFC) 102, a group delay element 122, and a signal divider 126. The AFC 102 is used for frequency locking the AM demodulator 100 with the pilot reference signal. Once the AM demodulator 100 is frequency locked to the pilot reference signal, the signal divider 126 is used for dividing out the distortion caused by, for example, fast Rayleigh fading.

To lock the AM demodulator 100 to the pilot reference signal, the AFC 102 includes a mixer 106, a pilot filter 112, an AFC tuner 116, and a controlled oscillator 120. The elements of the AFC 102 are, for example, implemented with conventional digital circuits, and operate at a predetermined sampling rate. For the purpose of illustration, the predetermined sampling rate of the elements of the AFC 102 operate at 6400 Hz. It will be appreciated that other sampling rates may be used as well. It will be further appreciated that, alternatively, the elements of the AFC 102 can be implemented with analog circuits.

The demodulation process begins by receiving the AM signal 104 at the mixer 106 which is referenced by a controlled reference signal 108 (operating at a controlled frequency) for generating a baseband signal 110. The baseband signal 110 is coupled to the pilot filter 112 which selectively filters the baseband signal 110 to extract the pilot reference signal 114. The AFC tuner 116 then samples the pilot reference signal 114 over a predetermined time interval, e.g., 125 milliseconds (ms), to determine an average pilot frequency. A first weighting function is then applied to the average pilot frequency to generate a weighted pilot frequency. Similarly, a second weighting function is applied to the controlled frequency to generate a weighted controlled frequency. The weighted pilot frequency is then summed with the weighted controlled frequency to provide an update frequency. The first weighting function is selected such that subsequent samples of the average pilot frequency determined from subsequent predetermined time intervals contribute less to a change in the update frequency than contributions made by prior samples of the average pilot frequency. The update frequency is used to modify the controlled reference signal 108 by way of an AFC control signal 118 such that its frequency matches the update frequency.

Once the controlled reference signal 108 has been updated, the AM signal 104 is again processed by the AFC 102 over a subsequent predetermined time interval. The updating process continues indefinitely so as to frequency lock the controlled reference signal 108 to the pilot reference signal 114.

The distortion of the AM signal 104 follows the equation $r(t)=E(t)e^{j\theta(t)}s(t)$, wherein r(t) is a complex envelope representation of the AM signal 104 received by the AM demodulator 100 with fast Rayleigh fading distortion, s(t) is the complex envelope representation of the AM signal 104 initially transmitted without the effect of fast Rayleigh fading. E(t) is the Rayleigh distribution envelope, and θ(t) is a uniformly distributed phase shift. The product of $E(t)e^{j\theta(t)}$ with s(t) creates the fast Rayleigh fading distortion.

To remove fast Rayleigh fading distortion, the signal divider 126 uses a complex divider to divide out the complex envelope factor $E(t)e^{j\theta(t)}$ from r(t). In order to synchronize the inputs to the signal divider 126, the group delay element 122 accounts for the delay in the pilot reference signal 114 caused by the pilot filter 112 by generating a delayed AM signal 124. The signal divider 126 divides out the distortion term $E(t)e^{j\theta(t)}$ from the delayed AM signal 124, thereby generating a filtered AM signal 128 substantially equal to the undisturbed AM signal s(t). Note the slash 2's across each signal line of the elements of the AM demodulator 100 represent a real and imaginary part of a signal on that line.

Figure 2:
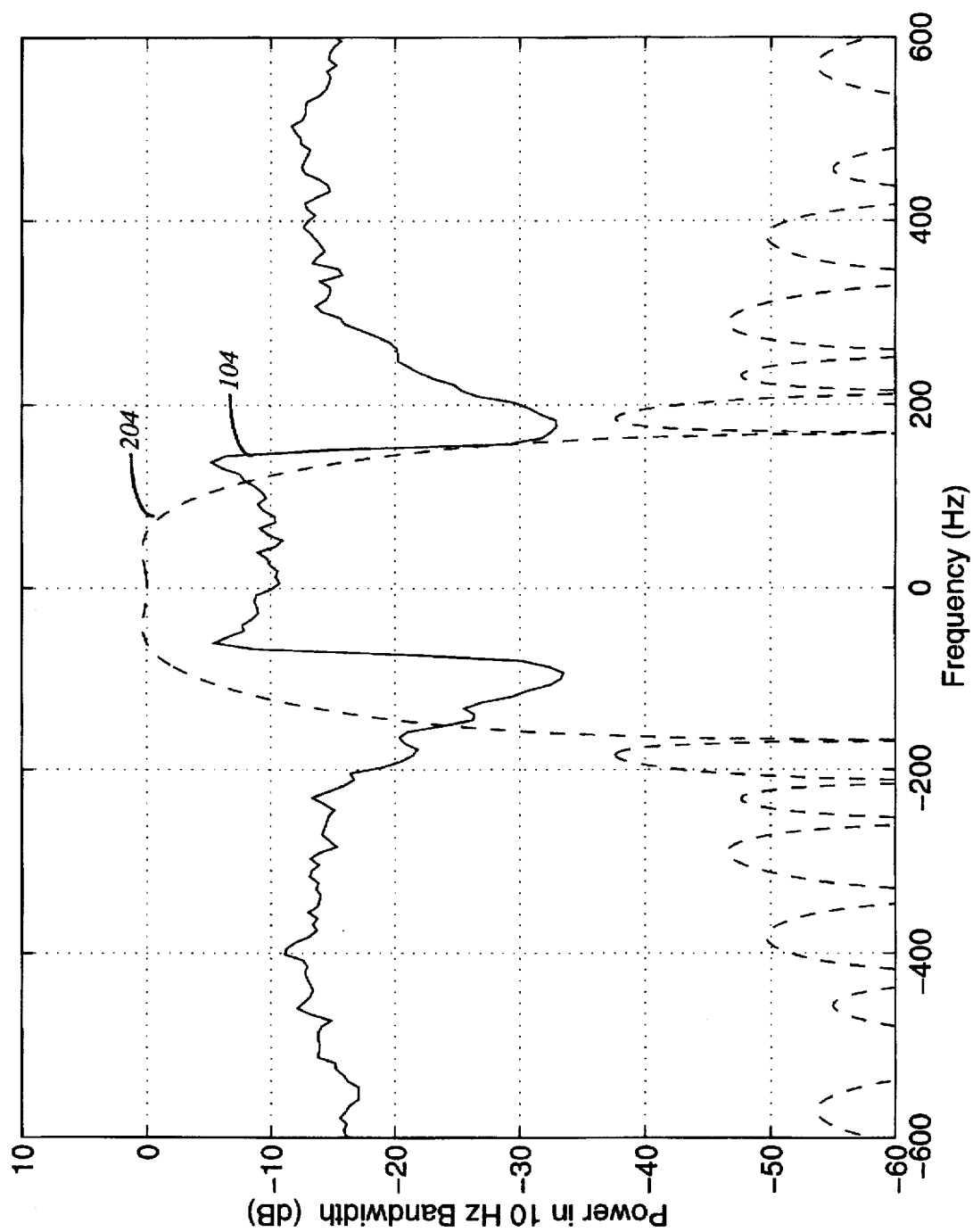
FIG. 2 is a spectral density diagram of a pilot reference signal and accompanying message sidebands affected by 60 mile per hour (mph) Rayleigh fading.

FIG. 2 is a spectral density diagram 200 of the pilot reference signal 114 and accompanying message sidebands affected by 60 mph Rayleigh fading. The solid curve represents the AM signal 104 affected by 60 mph Rayleigh fading with a frequency offset of 40 Hz. The dashed curve 204 represents a frequency response of the pilot filter 112, which operates as a low pass filter centered at DC. The AM signal 104 includes a pilot reference signal and two sidebands which have been distorted by 60 mph Rayleigh fading. The middle portion of the AM signal 104 which looks like a concave signal connected to two sidebands is the distorted pilot reference signal. In this example, the pilot reference signal 114 is offset by 40 Hz from the center of the passband of the pilot filter 112. The purpose of the AFC 102 is to center (i.e., lock) the pilot reference signal 114 to the pilot filter 112, thereby selectively filtering out the pilot reference signal 114 that has been distorted by fist Rayleigh fading without additional distortion from the sidebands, and without undesired attenuation of the pilot reference signal 114.

In order for the AFC 102 to be capable of frequency locking to the AM signal 104, it must be able to make an estimate of the offset frequency of the pilot reference signal 114. To make this estimate, a plurality of instantaneous frequency samples of the pilot reference signal are determined.

The theoretical instantaneous frequency shift $\dot{\theta}$ (derivative of instantaneous phase) introduced by the Rayleigh fading process follows the probability density function $$p(\dot{\theta}) = \frac{1}{\sqrt{2\omega_d}} \left[ 1 + 2\left(\frac{\dot{\theta}}{\omega_d}\right)^2 \right]^{-2/3},$$

wherein $\omega_d$ is the Doppler frequency and is given by $$\omega_d = 2\pi f_d = 2\pi v/c f_c,$$

wherein $f_c$ is the carrier frequency of, e.g., the AM signal 104, v is the fading velocity, and c is the speed of light.

The theoretical instantaneous frequency $\dot{\theta}$ can be approximated by a discrete-time instantaneous frequency function that is derived by letting the pilot reference signal 114 generated by the pilot filter 112 follow the complex envelope sequence $x_n + jy_n$, wherein n is a positive integer greater than zero representing an nth sample of the pilot reference signal 114. Taking the derivative of the phase of this sequence is approximated by the equation $$f_n = \frac{f_s}{2\pi} \cdot \frac{y_n x_{n-1} - x_n y_{n-1}}{y_n^2 + x_n^2},$$

wherein $f_n$ is an instantaneous frequency of the nth sample of the pilot reference signal 114, and $f_s$ is a predetermined sampling rate. This equation is simply a cross-multiplying and differentiating frequency discriminator. In Rayleigh fading, this signal exhibits the properties of random FM and has the same probability density as that given above (i.e., p($\dot{\theta}$)).

Figure 3:
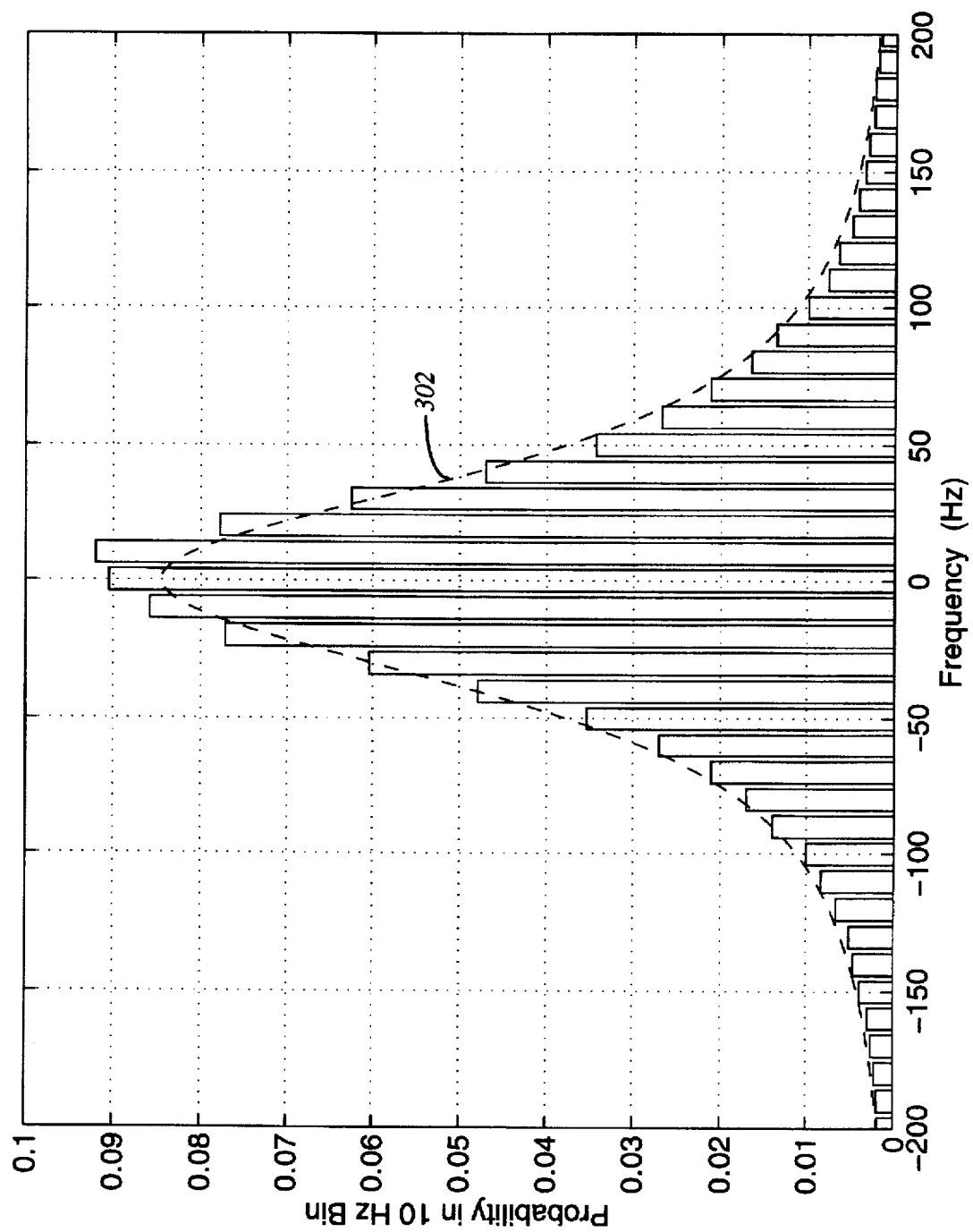
FIG. 3 is a diagram of a theoretical probability density function p($\dot{\theta}$) of an instantaneous frequency shift $\dot{\theta}$ versus a simulated FM distribution of $f_n$ in 60 mph fading with zero frequency offset.

FIG. 3 is a diagram 300 of a theoretical probability density function p($\dot{\theta}$) of an instantaneous frequency shift $\dot{\theta}$ versus a simulated FM distribution of $f_n$ in 60 mph fading with zero frequency offset. Note that this distribution spans an infinite range, even though the power spectral density is confined to $+\omega_d$. The dashed curve 302 is the theoretical probability density function p($\dot{\theta}$), and the rectangular bars represent datum points of the simulated FM distribution of $f_n$. As is evident, the simulated frequency distribution substantially approximates the theoretical frequency distribution. Hence, the discrete-time instantaneous frequency equation $f_n$ provides an accurate approximation of the instantaneous frequency of the pilot reference signal 114.

It follows from these results that from the 6400 Hz samples generated by the pilot filter 112, a noisy estimate of the frequency offset of the pilot reference signal 114 may be determined by discriminating the samples. However, it is undesirable to update the AFC control signal 118 at such a high rate. The pilot filter 112 is a narrowband filter with a large group delay of, e.g., 96 samples at 6400 Hz. If this delay is not compensated before the next update of the AFC control signal 118, oscillations will occur in the AFC 102. In addition, since fast updates are usually noisy updates, large spurs can occur in the output of the controlled oscillator 120 at multiples of the rate of updating the AFC control signal 118, and the performance could actually worsen. It is desirable that the update interval encompass several fades in order to average out the random FM distribution shown in FIG. 2. For this reason, a predetermined time interval of, for example, 125 ms (800 samples @6400 Hz) is used.

Large excursions in the instantaneous frequency offset measurements of $f_n$ are usually associated with low signal amplitudes. That is, when the AM signal 104 goes into a deep fade, it is more likely that a highly erroneous measurement will be made. For this reason, the AFC tuner 116 determines the average pilot frequency from an average of a plurality of instantaneous frequency samples derived from the pilot reference signal 114 during the predetermine time interval (e.g., 125 ms) at the predetermine sampling rate (e.g., 6400 Hz).

The plurality of instantaneous frequency samples is preferably calculated as a weighted average of the plurality of instantaneous frequency samples, thereby reducing the effect of erroneous noise from samples of the plurality of instantaneous frequency samples. If a weighted average of the plurality of instantaneous frequency samples is used, then each instantaneous frequency measurement is weighted according to an instantaneous pilot signal power and the estimate becomes $$f_{avg} = \frac{f_s}{2\pi} \cdot \frac{\sum_{n=K}^{T} y_n x_{n-1} - x_n y_{n-1}}{\sum_{n=K}^{T} y_n^2 + x_n^2},$$

wherein T and K are positive integers greater than zero, wherein T is greater than K, and wherein T is less than or equal to a total number of instantaneous frequency samples available from the pilot reference signal during the predetermined time interval at the predetermined sampling rate. For a sampling rate of 6400 Hz and a predetermined time interval of 125 ms, the summation factors are, for example, K=0 and T=799, i.e., 800 instantaneous frequency samples weighted over a 125 ms interval. However, it is preferable that the group delay of the pilot filter 112 be compensated before calculating the weighted average of the plurality of instantaneous frequency samples. To accomplish this, K is set equal to, for example 96 samples to account for the group delay of the pilot filter 112.

Figure 4:
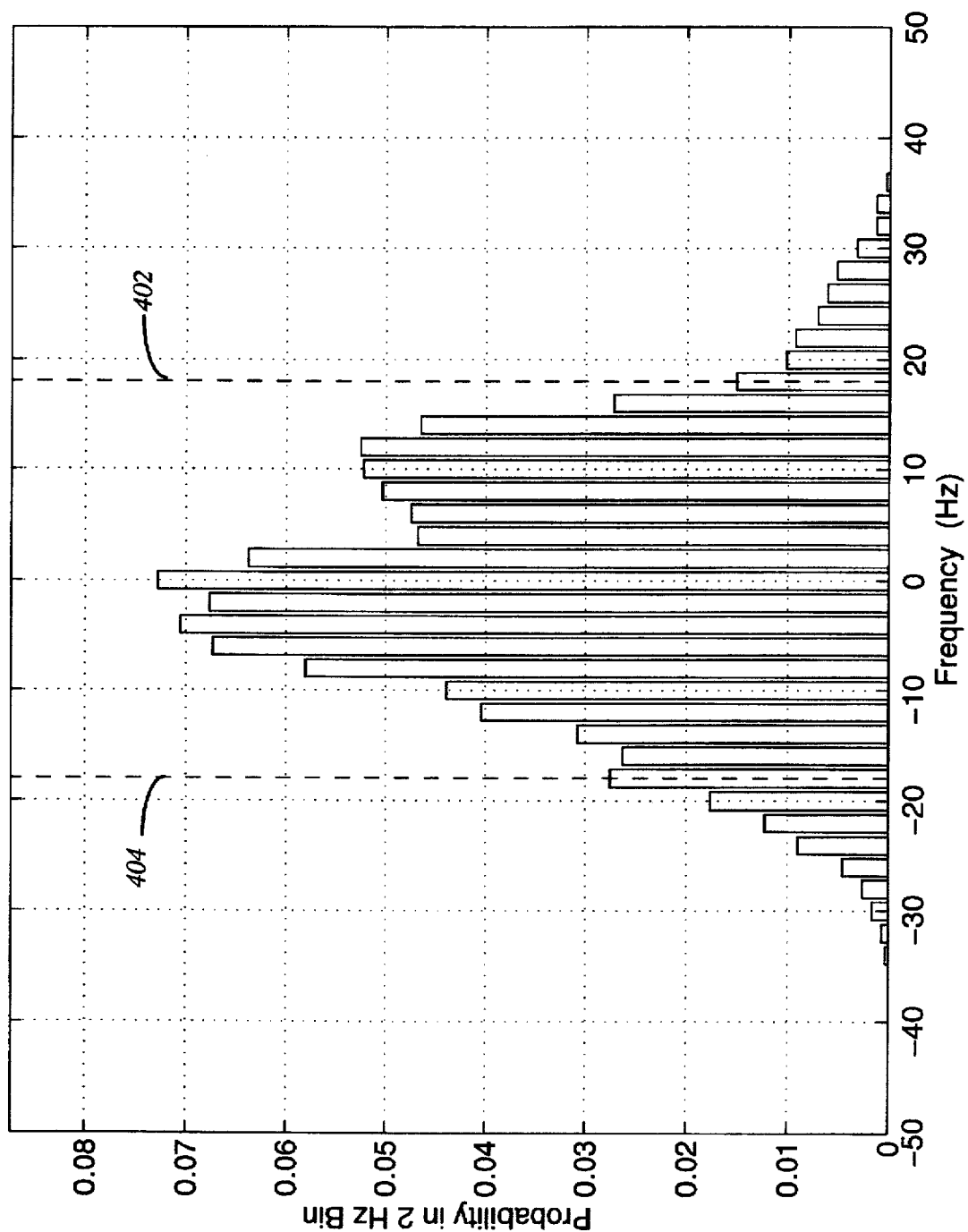
FIG. 4 is a simulated probability density diagram of a weighted average of 800 instantaneous frequency samples derived from the pilot reference signal over a 125 millisecond time interval at 6400 Hz.

FIG. 4 is a simulated probability density diagram 400 of a weighted average of 800 instantaneous frequency samples derived from the pilot reference signal 114 over a 125 ms time interval at 6400 Hz. The simulated distribution of the weighted average is for 60 mph fading. This distribution is significantly tighter than the distribution of FIG. 3. In fact, the weighted average shows that the distribution has 90% confidence (i.e., concentration) over a +18 Hz range 402, 404.

The autocorrelation of the random fading process is approximately limited in lag-time to one over twice the Doppler frequency, i.e., $1/(2f_d)$. In other words, most of the information in the 800 discriminator samples @6400 Hz is redundant due to the high correlation between samples. Hence, the weighted average of 800 instantaneous frequency samples can be reduced with negligible loss to accuracy. It follows then that a down-sampled weighted average of the plurality of instantaneous frequency samples follows the expression $$f_{avg} = \frac{f_s}{2\pi} \cdot \frac{\sum_{n=P}^{R} y_{Ln} x_{Ln-1} - x_{Ln} y_{Ln-1}}{\sum_{n=P}^{R} y_{Ln}^2 + x_{Ln}^2},$$

wherein R and P are positive integers greater than zero, and wherein R is greater than P. The constant R is also less than a total number of instantaneous frequency samples available from the pilot reference signal 114 during the predetermined time interval at the predetermined sampling rate. The factor L is a predetermined decimation factor of the total number of instantaneous frequency samples.

In the present example, L is set to 32, P is set to 0, and R is set to 24. These settings represent a weighted average over 25 discriminator samples where 200 Hz is the decimated sampling frequency over a 125 ms time interval. Note that, even though the down-sampled weighted average is being computed one out of every 32 discriminator samples, the differentiator is still computed at the high sampling rate of 6400 Hz. This is necessary in order to ensure linearity in the discriminator.

Figure 5:
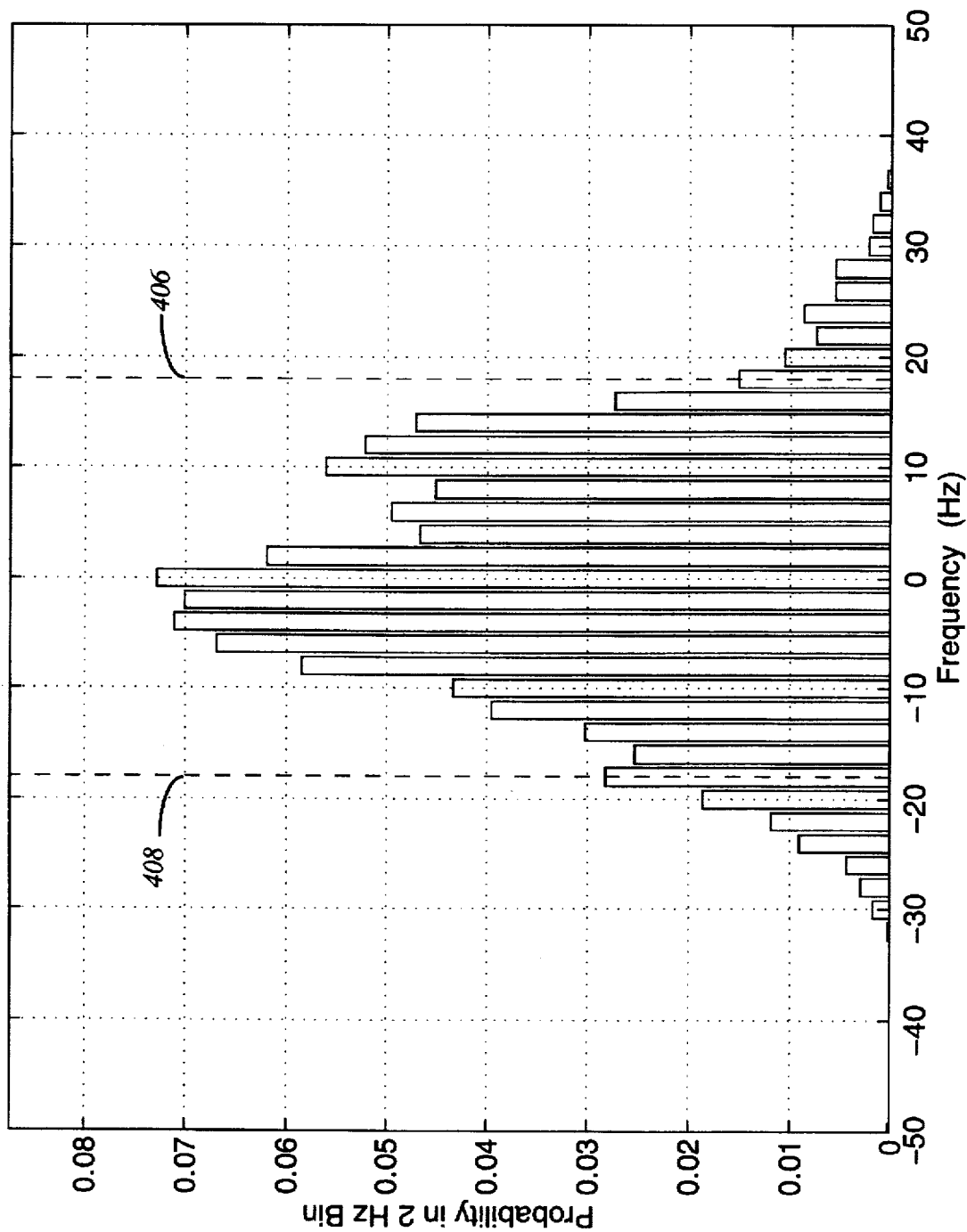
FIG. 5 is a simulated probability density diagram of the weighted average of 25 instantaneous frequency samples derived from the pilot reference signal over a 125 millisecond time interval at a decimated rate of 200 Hz.

FIG. 5 is a simulated probability density diagram of the weighted average of 25 instantaneous frequency samples derived from the pilot reference signal 114 over a 125 millisecond time interval at a decimated rate of 200 Hz. Note that this estimate has substantially the same distribution 406, 408 as that shown in FIG. 4 using 800 samples, thus illustrating the efficient nature of this down-sampled estimate which exploits the autocorrelation function of the fading. It will be appreciated that, alternatively, P can be set to 3 rather than 0 in order to compensate, for example, a 96 sample group delay of the pilot filter 112 prior to updating the AFC control signal 118.

The following equation summarizes the weighted average of the plurality of instantaneous frequency samples over a plurality of predetermined time intervals $$f_{m_{avg}} = \frac{f_s}{2\pi} \cdot \frac{\sum_{n=[(K+(m-1)N)/L]}^{mN/L} y_{Ln} x_{Ln-1} - x_{Ln} y_{Ln-1}}{\sum_{n=[(K+(m-1)N)/L]}^{mN/L} y_{Ln}^2 + x_{Ln}^2}$$

wherein $f_{m_{avg}}$ is the mth weighted average of the plurality of instantaneous frequency samples over the mth predetermined time interval, N is the total number of samples in an mth predetermined time interval, K is the number of samples that account for the group delay of the pilot filter 112, and m is a positive integer greater than zero.

For example, let the pilot filter 112 have a group delay of 96 samples (i.e., K=96), the predetermined time interval be 125 ms at a sampling rate of 6400 Hz (i.e., N=800 samples), and the weighted average function be down sampled by 32 samples (i.e., L=32). The weighted average function becomes $$f_{m_{avg}} = \frac{f_s}{2\pi} \cdot \frac{\sum_{n=3+(m-1)25}^{25m} y_{32n} x_{32n-1} - x_{32n} y_{32n-1}}{\sum_{n=3+(m-1)25}^{25m} y_{32n}^2 + x_{32n}^2}.$$

Hence, for m=1, the summation begins at the 96th sample (i.e., 32×3) and continues every other set of 32 samples until the 800th sample. For m=2, the summation begins at the 896th sample and ends at the 1600th sample, and so on.

The update strategy used for automatic frequency control is based on the down-sampled weighted average described above. The update is made, for example, once every 125 ms interval, i.e., at a rate of 8 Hz. It is important that the closed loop scheme be fast, but it should also have a small steady-state jitter. The update strategy assumes that the frequency offset is constant during the course of the AM signal 104 reception. Letting $u_{m-1}$ be the current controlled frequency of the controlled reference signal 108, the update frequency becomes $$u_m = u_{m-1} + \left(\frac{1}{m} \cdot f_{m_{avg}}\right),$$

wherein m is a positive integer greater than zero, and wherein the factor $1/m \cdot f_{m_{avg}}$ is derived from a first weighting function of $1/m$ applied to $f_{m_{avg}}$, an mth weighted average of the plurality of instantaneous frequency samples. Note that the current controlled frequency $u_{m-1}$ is weighted by a second weighting function equal to unity. It will be appreciated that the first and second weighting functions can use other suitable functions.

Thus, the update frequency $u_m$ is an mth update frequency of the controlled oscillator 120 based on $f_{m_{avg}}$ weighted by $1/m$ calculated over an mth predetermined time interval of the pilot reference signal 114. From the equation for the update frequency $u_m$, it is evident that the current controlled frequency $u_{m-1}$ is given more weight than $f_{m_{avg}}$. Moreover, the first weighting function $1/m$ attenuates the contribution of $f_{m_{avg}}$ as more updates are calculated over subsequent predetermined time intervals. Over an infinite time period this factor becomes zero. Hence, the first weighting function 1/m assumes that the frequency offset of the pilot reference signal 114 is constant. This weighting scheme is used to reduce the effect of erroneous frequency offset estimates, thereby providing minimal steady-state jitter.

Figure 6:
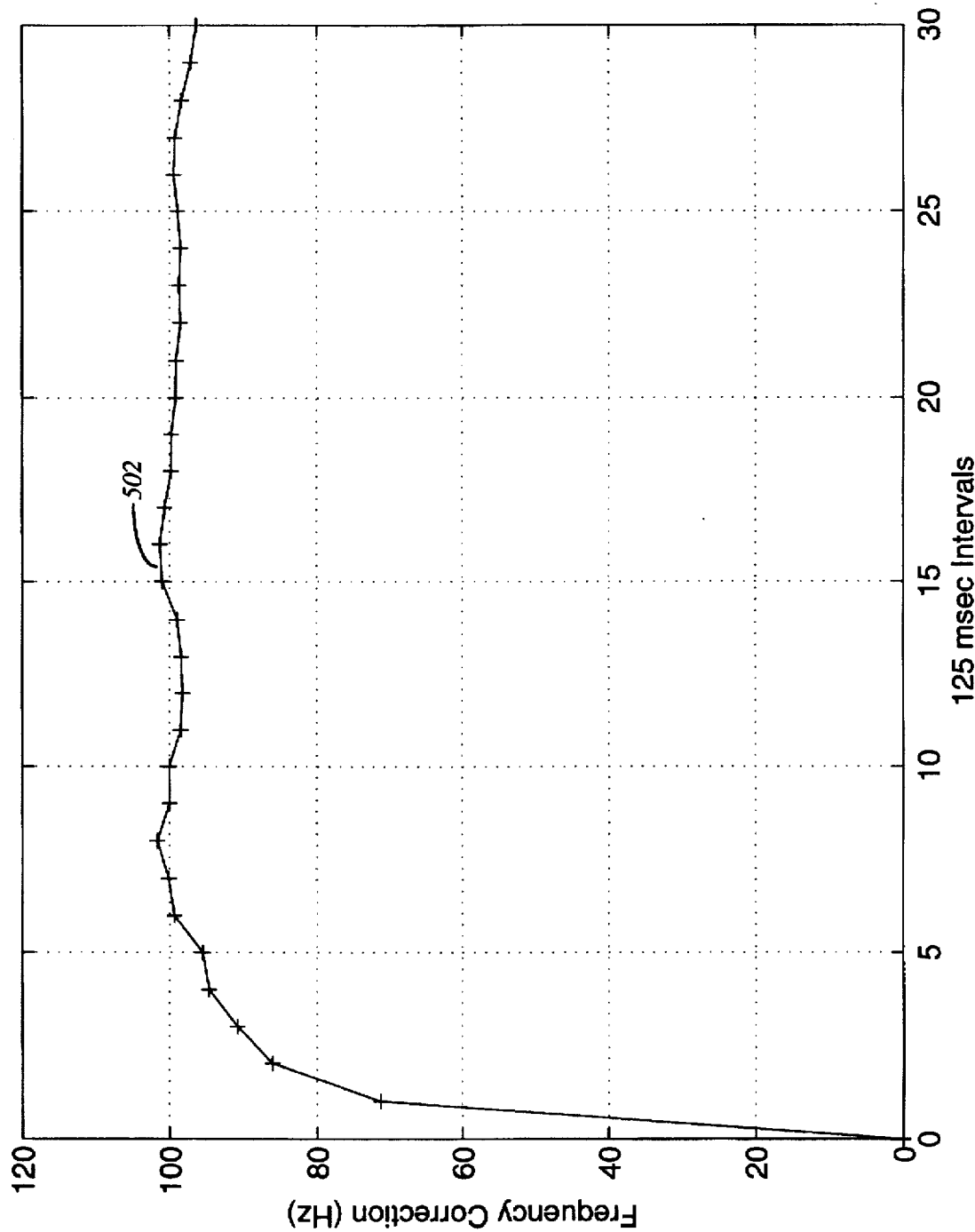
FIG. 6 is a sample function diagram of an automatic frequency control update process for a pilot reference signal affected by 60 mph Rayleigh fading with 100 Hz frequency offset over a plurality of predetermined time intervals.

FIG. 6 is a sample function diagram 500 of the automatic frequency control update process for the pilot reference signal 114 affected by 60 mph Rayleigh fading with 100 Hz frequency offset over a plurality of predetermined time intervals. Note from the curve 502 that by the first predetermined time interval (at intervals of 125 ms), the controlled oscillator 120 has been updated to a controlled frequency within 30 Hz of the offset frequency of the pilot reference signal 114. By the sixth predetermine time interval, the AFC 102 has locked to the pilot reference signal 114 with approximately a steady-state jitter of 2 Hz.

Figure 7:
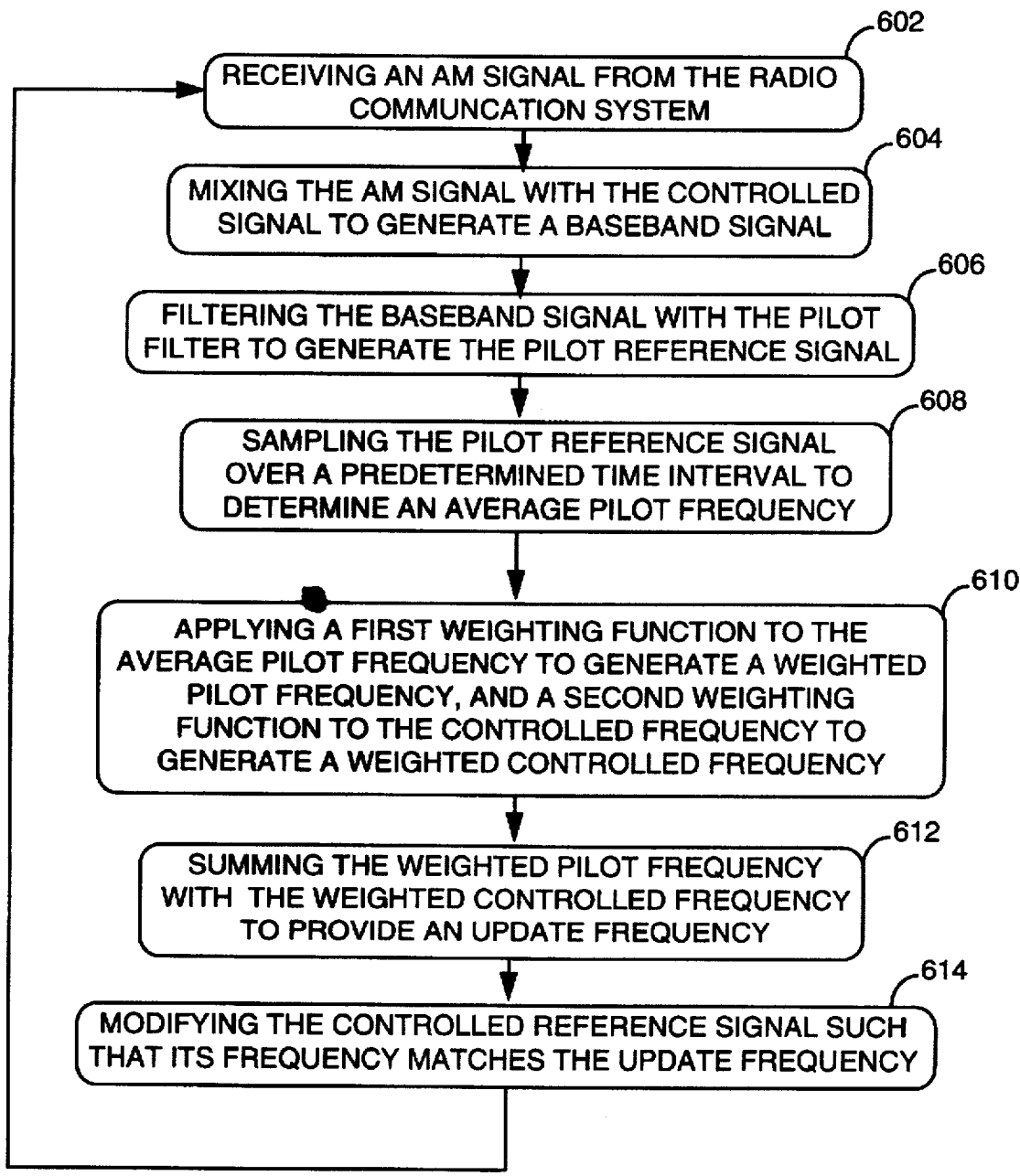
FIG. 7 is a flow chart summarizing the method applied by the AFC according to the present invention.

FIG. 7 is a flow chart 600 summarizing the method applied by the AFC 102 according to the present invention. The flow chart 600 begins with step 602 where the AFC 102 receives the AM signal 104 from, for example, a conventional receiver that demodulates a selective call signal from a radio communication system. In step 604 the mixer 106 is used for mixing the AM signal 104 with the controlled reference signal 108 to generate a baseband signal 110. The baseband signal 110 is thereafter filtered by the pilot filter 112 to extract the pilot reference signal 114 in step 606. In step 608 the AFC tuner 116 samples the pilot reference signal 114 over the predetermined time interval of, for example, 125 ms to determine an average pilot frequency. The average pilot frequency is preferably determined from the expression $$f_{avg} = \frac{f_s}{2\pi} \cdot \frac{\sum_{n=P}^{R} y_{L,n} x_{L,n-1} - x_{L,n} y_{L,n-1}}{\sum_{n=P}^{R} y_{L,n}^2 + x_{L,n}^2}$$

described above. For a plurality of predetermined time intervals, the average pilot frequency follows the expression $$f_{m_{avg}} = \frac{f_s}{2\pi} \cdot \frac{\sum_{n=[(K+(m-1)N)/L]}^{mN/L} y_{L,n} x_{L,n-1} - x_{L,n} y_{L,n-1}}{\sum_{n=[(K+(m-1)N)/L]}^{mN/L} y_{L,n}^2 + x_{L,n}^2}$$

In step 610 the AFC tuner 116 applies a first weighting function to the average pilot frequency, wherein the first weighting function applied to the average pilot frequency is equal to $1/m \cdot f_{m_{avg}}$, to generate a weighted pilot frequency. A second weighting function, that is preferably equal to unity, is applied to the controlled frequency to generate a weighted controlled frequency. In step 612 the weighted pilot frequency and the weighted controlled frequency are combined together to provide an update frequency that preferably is determine from the expression $$u_m = u_{m-1} + \left( \frac{1}{m} \cdot f_{m_{avg}} \right).$$

In step 614 the controlled reference signal 108 is modified such that its frequency is made to match the update frequency $u_m$. The AFC tuning process continues from step 602 where a subsequent predetermined interval is processed as described above. This process continues repeatedly so as to lock the controlled reference signal 108 to the pilot reference signal 114.

Figure 8:
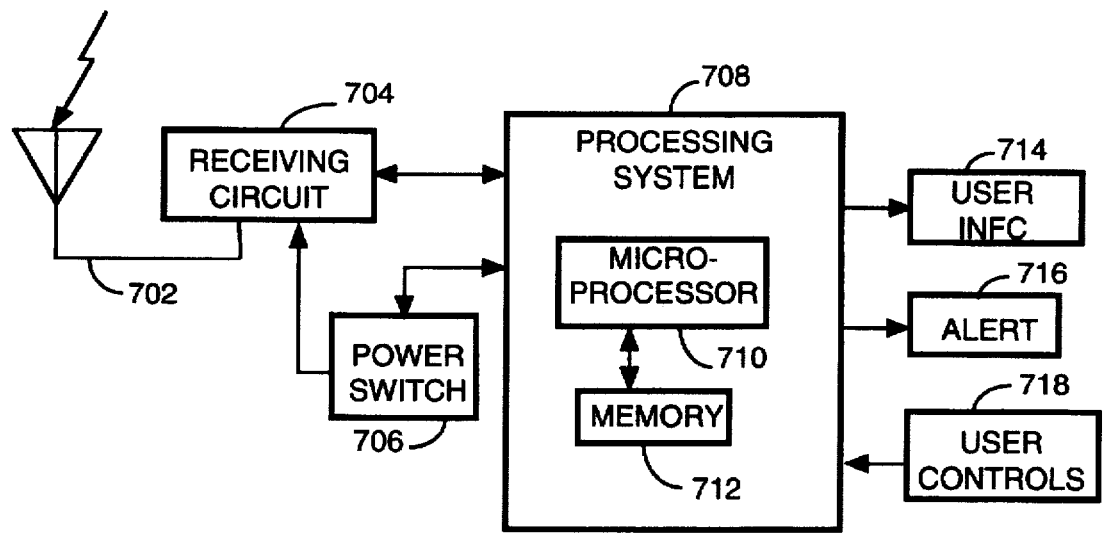
FIG. 8 is an electrical block diagram of a radio receiver that uses automatic frequency control for locking a controlled reference signal to the pilot reference signal according to the present invention.

FIG. 8 is an electrical block diagram of a radio receiver 700 that uses automatic frequency control for locking the controlled reference signal to the pilot reference signal 114 according to the present invention. The radio receiver 700 receives selective call signals, composed of selective call messages, transmitted by a radio communication system (not shown) using techniques well known in the art. The selective call messages are originated by a caller who communicates with the radio communication system in a conventional manner to send messages intended for the user of the radio receiver 700.

The radio receiver 700 comprises a receiver antenna 702, a receiving circuit 704, a power switch 706, a processing system 708, user controls 718, an alerting device 716, and a user interface 714.

The receiver antenna 702 is coupled to the receiving circuit 704 for receiving the selective call signal transmitted by the radio communication system. The selective call signal is an AM signal including a pilot reference signal such as the one described above. The receiving circuit 704 is also coupled to the power switch 706. The power switch 706 utilizes a conventional circuit element such as, for example, a MOS switch for shutting down power to the receiving circuit 704. Operation of the power switch 706 is controlled by the processing system 708, which determines particular moments during the decoding process of the selective call signal when shutdown of the receiving circuit 704 is appropriate for providing a conventional battery saving function.

The processing system 708 controls the overall operations of the radio receiver 700. One such operation is the operation of locking the radio receiver 700 to the AM signal. This operation is accomplished by sampling the output of the receiving circuit 704 with, for example, a conventional analog-to-digital converter (not shown), and processing the samples by way of the elements of the processing system 708 which perform the function of the AM demodulator 100 described above.

The elements of the processing system 708 include a microprocessor 710, and a memory 712. The microprocessor 710 is similar to the M68HC08 micro-controller manufactured by Motorola, Inc. It will be appreciated that other similar processors can be utilized for the microprocessor 710, and that additional processors of the same or alternative type can be added as required to handle the processing requirements of the microprocessor 710. It will be further appreciated that, alternatively, the AM demodulator 100 can be an application specific integrated circuit (ASIC) that can perform the same AFC functions described above.

The memory 712 includes, for example, a conventional random access memory (RAM), and a conventional read-only memory (ROM). The RAM is used for storage and processing of, for example, instantaneous frequency samples of the pilot reference signal 114. The ROM section is used for storage of the instructions that control the operation of the processing system 708. It will be appreciated that other types of memory may be used such as, for example, FLASH memory. It will be further appreciated that the memory 712, singly or in combination, can be an integral portion of the microprocessor 710.

During message reception, the microprocessor 710 is preferably programmed to accomplish the task of the AM demodulator 100, i.e., process samples from the selective call signal in a manner that locks the radio receiver 700 with the pilot reference signal 114. It will be appreciated that, alternatively, the AM demodulator 100 can be implemented with conventional digital logic that performs the functions of the AM demodulator 100 described above. It will be further appreciated that a digital implementation of the AM demodulator 100 can be an integral element of the processing system 708, or an ASIC device coupled to the processing system 708.

Once the radio receiver 700 is frequency locked to the pilot reference signal 114, the microprocessor 710 then decodes a selective call address from the selective call message, compares the decoded selective call address with one or more of the selective call addresses stored in the memory 712, and when a match is detected, proceeds to process the remaining portion of the selective call message.

After the processing system 708 has processed the selective call message, the selective call message is stored in the memory 712, and a call alerting signal is generated to alert a user that the selective call message has been received. The call alerting signal is directed to a conventional audible or tactile alerting device 716 for generating an audible or tactile call alerting signal. The selective call message can be accessed by the user through user controls 718, which provide functions such as lock, unlock, delete, read, etc. More specifically, by the use of appropriate functions provided by the user controls 718, the message is recovered from the memory 712, and then displayed on the user interface 714. The user interface 714 is a conventional display such as, for example, a liquid crystal display (LCD) used for conveying the information included in the selective call message to the user.

The present invention provides a novel method for locking a controlled reference signal 108 to a pilot reference signal 114 that has been distorted by, for example, fast Rayleigh fading. In particular, the present invention provides an accurate estimate of the average frequency of the pilot reference signal 114 by calculating a weighted average of a plurality of instantaneous frequency samples of the pilot reference signal 114. By weighting the average of a plurality of instantaneous frequency samples, the effects from erroneous samples is reduced. Moreover, by down-sampling the pilot reference signal 114 the number of calculations made by the processing system 708 is minimized, thereby improving the overall battery life of the radio receiver 700.

What is claimed is:

1. In a radio receiver that uses automatic frequency control, a method for locking a controlled reference signal to a pilot reference signal that has been distorted by multipath fading, comprising:
   (a) receiving a signal from a radio communication system, wherein the signal includes the pilot reference signal;
   (b) mixing the signal with the controlled reference signal to generate a baseband signal, wherein the controlled reference signal operates at a controlled frequency;
   (c) filtering the baseband signal to extract the pilot reference signal;
   (d) sampling the pilot reference signal over a predetermined time interval to determine an average pilot frequency;
   (e) applying a first weighting function to the average pilot frequency to generate a weighted pilot frequency, and a second weighting function to the controlled frequency to generate a weighted controlled frequency;
   (f) summing the weighted pilot frequency with the weighted controlled frequency to provide an update frequency;
   (g) modifying the controlled reference signal such that its frequency matches the update frequency; and
   (h) repeating steps (a) through (g) so as to lock the controlled reference signal to the pilot reference signal.

2. A method as set forth in claim 1, wherein the first weighting function is selected such that subsequent samples of the average pilot frequency determined from subsequent predetermined time intervals contribute less to a change in the update frequency than contributions made by prior samples of the average pilot frequency.

3. A method as set forth in claim 1, wherein the first weighting function applied to the average pilot frequency is equal to $1/m \cdot f_{m_{avg}}$, wherein m is a positive integer greater than zero, and wherein $f_{m_{avg}}$ corresponds to an mth weighted average of a plurality of instantaneous frequency samples calculated over an mth predetermined time interval of sampling the pilot reference signal.

4. A method as set forth in claim 1, wherein the average pilot frequency is determined by calculating an average of a plurality of instantaneous frequency samples derived from the pilot reference signal during the predetermined time interval at a predetermined sampling rate.

5. A method as set forth in claim 4, wherein the average of the plurality of instantaneous frequency samples is calculated as a weighted average of the plurality of instantaneous frequency samples, thereby reducing an effect of erroneous noise from samples of the plurality of instantaneous frequency samples.

6. A method as set forth in claim 5, wherein the weighted average of the plurality of instantaneous frequency samples is equal to $$f_{avg} = \frac{f_s}{2\pi} \cdot \frac{\sum_{n=K}^{T} y_n x_{n-1} - x_n y_{n-1}}{\sum_{n=K}^{T} y_n^2 + x_n^2},$$

wherein T and K are positive integers greater than zero, wherein T is greater than K, wherein T is less than or equal to a total number of instantaneous frequency samples available from the pilot reference signal during the predetermined time interval at the predetermined sampling rate, and wherein the first weighting function applied to the average pilot frequency is equal to $1/m \cdot f_{m_{avg}}$, wherein m is a positive integer greater than zero, and wherein $f_{m_{avg}}$ corresponds to an mth weighted average of the plurality of instantaneous frequency samples calculated over an mth predetermined time interval of sampling the pilot reference signal.

7. A method as set forth in claim 5, wherein the weighted average of the plurality of instantaneous frequency samples is equal to $$f_{avg} = \frac{f_s}{2\pi} \cdot \frac{\sum_{n=P}^{R} y_{Ln} x_{Ln-1} - x_{Ln} y_{Ln-1}}{\sum_{n=P}^{R} y_{Ln}^2 + x_{Ln}^2},$$

wherein R and P are positive integers greater than zero, wherein R is greater than P, wherein R is less than a total number of instantaneous frequency samples available from the pilot reference signal during the predetermined time interval at the predetermined sampling rate, wherein L is a predetermined decimation factor of the total number of instantaneous frequency samples, and wherein the first weighting function applied to the average pilot frequency is equal to $1/m \cdot f_{m_{avg}}$, wherein m is a positive integer greater than zero, and wherein $f_{m_{avg}}$ corresponds to an mth weighted average of the plurality of instantaneous frequency samples calculated over an mth predetermined time interval of sampling the pilot reference signal.

8. In a radio receiver that uses automatic frequency control, a method for locking a controlled reference signal to a pilot reference signal that has been distorted by multipath fading, comprising:
   (a) receiving a signal from a radio communication system, wherein the signal includes the pilot reference signal;
   (b) mixing the signal with the controlled reference signal to generate a baseband signal, wherein the controlled reference signal operates at a controlled frequency;
   (c) filtering the baseband signal to extract the pilot reference signal;
   (d) sampling the pilot reference signal over a predetermined time interval to determine an average pilot frequency;
   (e) applying a first weighting function to the average pilot frequency to generate a weighted pilot frequency, and a second weighting function to the controlled frequency to generate a weighted controlled frequency;
   (f) summing the weighted pilot frequency with the weighted controlled frequency to provide an update frequency, wherein the first weighting function is selected such that subsequent samples of the average pilot frequency determined from subsequent predetermined time intervals contribute less to a change in the update frequency than contributions made by prior samples of the average pilot frequency;
   (g) modifying the controlled reference signal such that its frequency matches the update frequency; and
   (h) repeating steps (a) through (g) so as to lock the controlled reference signal to the pilot reference signal.

9. A radio receiver that uses automatic frequency control for locking a controlled reference signal to a pilot reference signal that has been distorted by multipath fading, the radio receiver comprising:
   a processing system for directing operations of the radio receiver;
   a receiving circuit for receiving a signal from a radio communication system, wherein the signal includes the pilot reference signal;
   a controlled oscillator for generating the controlled reference signal operating at a controlled frequency;
   a mixer for mixing the signal with the controlled reference signal to generate a baseband signal;
   a pilot filter coupled to the processing system for filtering the baseband signal to extract the pilot reference signal; and
   wherein the processing system is programmed to
   (a) sample the pilot reference signal over a predetermined time interval to determine an average pilot frequency,
   (b) apply a first weighting function to the average pilot frequency to generate a weighted pilot frequency, and a second weighting function to the controlled frequency to generate a weighted controlled frequency,
   (c) sum the weighted pilot frequency with the weighted controlled frequency to provide an update frequency,
   (d) modify the controlled reference signal such that its frequency matches the update frequency, and
   (e) repeat steps (a) through (d) so as to lock the controlled reference signal to the pilot reference signal.

10. The radio receiver as set forth in claim 9, wherein the processing system is programmed to determine the average pilot frequency by calculating an average of a plurality of instantaneous frequency samples derived from the pilot reference signal during the predetermined time interval at a predetermined sampling rate.

11. The radio receiver as set forth in claim 10, wherein the processing system is programmed to determine the average of the plurality of instantaneous frequency samples as a weighted average of the plurality of instantaneous frequency samples, thereby reducing an effect of erroneous noise from samples of the plurality of instantaneous frequency samples.

12. The radio receiver as set forth in claim 11, wherein the processing system is programmed to determine the weighted average of the plurality of instantaneous frequency samples in accordance with $$f_{avg} = \frac{f_s}{2\pi} \cdot \frac{\sum_{n=P}^{R} y_{L \cdot n} x_{L \cdot n-1} - x_{L \cdot n} y_{L \cdot n-1}}{\sum_{n=P}^{R} y_{L \cdot n}^2 + x_{L \cdot n}^2},$$

wherein R and P are positive integers greater than zero, wherein R is greater than P, wherein R is less than a total number of instantaneous frequency samples available from the pilot reference signal during the predetermined time interval at the predetermined sampling rate, wherein L is a predetermined decimation factor of the total number of instantaneous frequency samples, and wherein the first weighting function applied to the average pilot frequency is equal to $1/m \cdot f_{m_{avg}}$, wherein m is a positive integer greater than zero, and wherein $f_{m_{avg}}$, corresponds to an mth weighted average of the plurality of instantaneous frequency samples calculated over an mth predetermined time interval of sampling the pilot reference signal.

13. A radio receiver that uses automatic frequency control for locking a controlled reference signal to a pilot reference signal that has been distorted by multipath fading, the radio receiver comprising:
   a processing system for directing operations of the radio receiver;
   a receiving circuit for receiving a signal from a radio communication system, wherein the signal includes the pilot reference signal;
   a controlled oscillator for generating the controlled reference signal operating at a controlled frequency;
   a mixer for mixing the signal with the controlled reference signal to generate a baseband signal;
   a pilot filter coupled to the processing system for filtering the baseband signal to extract the pilot reference signal; and
   wherein the processing system is programmed to
   (a) sample the pilot reference signal over a predetermined time interval to determine an average pilot frequency,
      wherein the average pilot frequency is determined by calculating an average of a plurality of instantaneous frequency samples derived from the pilot reference signal during the predetermined time interval at a predetermined sampling rate, and
      wherein the average of the plurality of instantaneous frequency samples is calculated as a weighted average of the plurality of instantaneous frequency samples, thereby reducing an effect of erroneous noise from samples of the plurality of instantaneous frequency samples, (b) apply a first weighting function to the average pilot frequency to generate a weighted pilot frequency, and a second weighting function to the controlled frequency to generate a weighted controlled frequency, (c) sum the weighted pilot frequency with the weighted controlled frequency to provide an update frequency, (d) modify the controlled reference signal such that its frequency matches the update frequency, and (e) repeat steps (a) through (d) so as to lock the controlled reference signal to the pilot reference signal.

14. The radio receiver as set forth in claim 13, wherein the processing system is programmed to determine the weighted average of the plurality of instantaneous frequency samples in accordance with $$f_{avg} = \frac{f_s}{2\pi} \cdot \frac{\sum_{n=P}^{R} y_{L,n} x_{L,n-1} - x_{L,n} y_{L,n-1}}{\sum_{n=P}^{R} y_{L,n}^2 + x_{L,n}^2},$$

wherein R and P are positive integers greater than zero, wherein R is greater than P, wherein R is less than a total number of instantaneous frequency samples available from the pilot reference signal during the predetermined time interval at the predetermined sampling rate, wherein L is a predetermined decimation factor of the total number of instantaneous frequency samples, and wherein the first weighting function applied to the average pilot frequency is equal to $1/m \cdot f_{m_{avg}}$, wherein m is a positive integer greater than zero, and wherein $f_{m_{avg}}$ corresponds to an mth weighted average of the plurality of instantaneous frequency samples calculated over an mth predetermined time interval of sampling the pilot reference signal.

* * * * *